United States Patent [19]
Okuno

[11] Patent Number: 5,849,080
[45] Date of Patent: Dec. 15, 1998

[54] APPARATUS FOR PRODUCING POLYCRYSTALLINE SEMICONDUCTORS

[75] Inventor: Tetsuhiro Okuno, Shiki-gun, Japan

[73] Assignee: Sharp Kabushiki Kaisha, Osaka, Japan

[21] Appl. No.: 763,115

[22] Filed: Dec. 10, 1996

[30]     Foreign Application Priority Data

Dec. 28, 1995  [JP]  Japan ................................. 7-344136

[51] Int. Cl.⁶ .................................................. C30B 35/00
[52] U.S. Cl. ............................. 117/222; 117/19; 117/224
[58] Field of Search .................................. 117/202, 204,
117/206, 219, 222, 224, 3, 4, 10, 11

[56]              References Cited

U.S. PATENT DOCUMENTS

| | | | |
|---|---|---|---|
| 3,615,205 | 10/1971 | Blue et al. | 117/83 |
| 3,628,998 | 12/1971 | Blum et al. | 117/83 |
| 3,898,051 | 8/1975 | Schmid | 117/83 |
| 4,050,905 | 9/1977 | Swinehart | 117/83 |
| 4,055,457 | 10/1977 | Swinehart | 117/83 |
| 4,175,610 | 11/1979 | Zaubar et al. | 164/122.2 |
| 5,714,004 | 2/1998 | Okuno | 117/3 |

FOREIGN PATENT DOCUMENTS

| | | |
|---|---|---|
| 48884A1 | 12/1996 | European Pat. Off. . |
| 57-21515 | 5/1982 | Japan . |
| 58-54115 | 12/1983 | Japan . |
| 62-620710 | 11/1987 | Japan . |
| 2279585 | 1/1995 | United Kingdom . |

OTHER PUBLICATIONS

"Convective Interference and 'Effective Diffusion–Controlled Segregation during Directional Solidification under Stabilizing Vertical Thermal Gradients; Ge'" by D. Holmes et al., J. Electrochemical Society: Solid–State Science and Technology Feb. 1981 pp. 429–437.

*Primary Examiner*—Felisa Garrett
*Attorney, Agent, or Firm*—Birch, Stewart, Kolasch & Birch, LLP

[57]              ABSTRACT

A process and an apparatus for producing a polycrystalline semiconductor including charging a raw semiconductor material into a crucible, heating to melt the raw semiconductor material in the crucible by heating means, solidifying the melted material while depriving the bottom of the crucible of heat, and then cooling the crucible to cool the solidified semiconductor, in an atmosphere inert to the semiconductor throughout, characterized by alternately subjecting the semiconductor crystal to growth and annealing in the solidification step while periodically varying the amount of heat liberated from the raw semiconductor material.

2 Claims, 6 Drawing Sheets

APPARATUS FOR PRODUCING POLYCRYSTALLINE SEMICONDUCTORS

BACKGROUND OF THE INVENTION

1. Field of the Invention

The present invention relates to a process and an apparatus for producing polycrystalline semiconductors. More particularly, it is concerned with a process and an apparatus for producing polycrystalline silicon semiconductors with minimized stress distortion.

2. Description of the Related Art

Silicon is an excellent raw material for production of industrial products, and is used, for example, as a semiconductor material for preparation of ICs (integrated circuits), etc., and as a material for preparation of solar cells; it is a really excellent material from the standpoint of resource that finds many applications in the aforeindicated areas. More specifically, silicon has been used for manufacturing almost all the solar cells now in practical use. The currently dominating solar cells for power supply are based on single-crystal silicon, and thus further development of solar cells made of high-quality polycrystalline silicon is expected for cost reduction.

However, since the conversion efficiency of currently available polycrystalline silicon is lower than that of single-crystal silicon, the first consideration is the development of polycrystalline silicon of sufficiently high quality for the manufacture of solar cells.

According to the conventional process for producing polycrystalline silicon semiconductors, solid silicon in a silica crucible is melted in a heating furnace, and is then cast into a graphite crucible. Another recently known method is melting in a vacuum or in an inert gas to prevent mixing of oxygen or nitrogen gas, etc. into the silicon to thereby improve the quality and prevent dusting.

Additional known processes include the semi-continuous casting furnace process of Wacker-Chemitronie GmbH in Germany, wherein silicon is melted in a vacuum or in an inert gas in a silicon crucible, and is then poured into a mold made of graphite or the like by inclining the crucible (Japanese Examined Patent Application Publication SHO 57-21515); the HEM (Heat Exchange Method) of Crystal Systems, Inc. in the U.S., wherein silicon is melted in a vacuum in a silica crucible, and is then solidified directly therein (Japanese Examined Patent Application Publication SHO 58-54115); an improvement of the Wacker' process, wherein a water-cooled steel plate is used as the silicon melting crucible (Japanese Unexamined Patent Application Disclosure SHO 62-260710); etc.

According to any of the processes for producing silicon, the amount of heat liberated during the step of solidifying the silicon semiconductor is controlled to be constant. As a result, the EPD (Etch Pit Density), a measure of the quality of the resulting crystal is usually up to $10^5/cm^2$ which is significantly higher than $<10^2/cm^2$ of single crystals.

Some attempts have been made according to the prior art in order to increase the EPD by anneal processing. For example, Japanese Examined Patent Application Publication SHO 58-54115 discloses the control of the crucible temperature after solidification, to facilitate annealing (see lines 33–36 in the 2nd column). However, semiconductor ingots, being usually as large as 30–50 cm square, encounter difference in temperature between the center and the periphery during the process of annealing when annealed after having solidified, and thus the annealing step intended for the release of stress distortion tends to cause distortion instead; therefore, the annealing has little effect. As a result, a polycrystal with a high EPD tend to be produced.

As mentioned above, since the annealing step according to the prior art is performed after the semiconductor has solidified, the annealing effect is not sufficient, and recently this poor appealing effect is becoming more serious due to the trend toward production of larger semiconductor ingots from an economical point of view.

SUMMARY OF THE INVENTION

In view of the problems mentioned above, it is an object of the present invention to provide a process and an apparatus for producing a polycrystalline semiconductor with excellent crystallographic properties and minimized stress distortion by alternately subjecting a semiconductor crystal to growth and annealing in the solidification step while periodically varying the amount of heat liberated from the semiconductor material.

Throughout the specification and the claims, "under an inert atmosphere" means "in a vacuum or under an atmosphere of an inert gas which prevents oxidation of the heated raw semiconductor material present" which is realized in an airtight vessel. Also, throughout the specification and the claims, "the underside temperature of the bottom of the crucible" and "a second temperature detected by second-temperature detecting means" refer to the same temperature indicated by T2, and these expressions are used interchangeably for convenience.

The present invention provides a process for producing a polycrystalline semiconductor comprising charging a raw semiconductor material into a crucible, heating to melt the raw semiconductor material in the crucible by heating means, solidifying the melted material while depriving the bottom of the crucible of heat, and then cooling the crucible to cool the solidified semiconductor, in an atmosphere inert to the semiconductor throughout, characterized by alternately subjecting the semiconductor crystal to growth and annealing in the solidification step while periodically varying the amount of heat liberated from the raw semiconductor material.

According to a characteristic aspect of the present invention, the amount of heat liberated is preferably varied in the solidification step by periodically increasing and decreasing the temperature of the vicinity of the solid/liquid boundary of the melted raw material (hereunder referred to as solid/liquid temperature) within a predetermined range with its center at the melting point of the raw semiconductor material.

More preferably, the total time of the periods of larger amount of heat liberated is set to ten times or less the total time of the periods of smaller amount of heat liberated according to another characteristic aspect of the present invention.

According to yet another characteristic aspect of the invention, in order to periodically vary the amount of heat liberated, it is preferred that coolant is used to deprive the bottom of the crucible of heat, and the coolant is periodically switched to another coolant.

According to yet another characteristic aspect of the invention, in order to periodically vary the amount of heat liberated, it is also preferred that a coolant is used to deprive the bottom of the crucible of heat, and the flow of the coolant is adjusted.

In addition, in order to periodically vary the amount of heat liberated, it is also preferred that a crucible-supporting bed with a hollow structure being in contact with the bottom of the crucible is provided to deprive the bottom of the crucible of heat, and an adiabatic piece is loaded in and unloaded from the hollow structure, according to yet another characteristic aspect of the present invention.

The invention also provides an apparatus for producing polycrystalline semiconductors comprising:

an airtight vessel;

a crucible placed in the airtight vessel for receiving a raw semiconductor material;

heating means for heating the crucible at a level above its bottom to melt the raw semiconductor material;

a supporting bed which supports the underside of the bottom of the crucible to mount the crucible, and has a hollow structure which allows an adiabatic piece to be loaded in and unloaded from the hollow structure;

cooling means for cooling the supporting bed; and driving means for driving rotation of the supporting bed about the vertical axis as well as for driving upward and downward movement of the supporting bed.

The production apparatus is preferably characterized by further comprising:

a first-temperature detecting means for detecting a first temperature T1 at which the crucible is heated by the heating means;

a second-temperature detecting means for detecting a second temperature T2 of the bottom underside of the crucible; and control means for controlling the heating means so that the first temperature T1 increases over the melting temperature of the raw semiconductor material in response to respective outputs of the first-temperature detecting means and the second-temperature detecting means, and so that the first temperature T1 falls at the instant the rate $\Delta T$ of time-dependent change of the second temperature T2 detected by the second-temperature detecting means increases over a predetermined value.

The raw semiconductor material used in the process and the apparatus for producing polycrystalline semiconductors is preferred to be polysilicon, in which case polycrystalline silicon is produced as the polycrystalline semiconductor.

According to the invention, in a process for producing a polycrystalline semiconductor which comprises charging a raw semiconductor material into a crucible, heating to melt the raw semiconductor material in the crucible by heating means, solidifying the melted material while depriving the bottom of the crucible of heat, and cooling the crucible to cool the solidified semiconductor, in an atmosphere inert to the semiconductor throughout, a polycrystalline semiconductor with excellent crystallographic properties and minimized stress distortion is obtained by alternately subjecting a semiconductor crystal to growth and annealing in the solidification step while periodically varying the amount of heat liberated from the semiconductor material.

The crucible is heated by heating means provided at a distance from the crucible in a conventional manner, and radiant heat is applied from the top of the crucible to the raw semiconductor material in the crucible to melt the material. The sidewall of the crucible is also heated by the heating means to higher temperatures to facilitate melting of the raw semiconductor material. Here, the melting of the raw semiconductor material is performed in an atmosphere inert to the semiconductor.

Since the raw semiconductor material absorbs heat when it melts, control of the electric power supplied to the heating means by the control means to maintain the temperature of the crucible at a constant value results in a lower amount of heat required to melt the material remaining in the crucible, and this causes increase in the temperature of the crucible, particularly the temperature of the bottom underside of the crucible. Accordingly, the change of the underside temperature T2 of the bottom of the crucible reflects the progress of melting of the raw semiconductor material in the crucible, and therefore the heating of the crucible by the heating means is immediately suspended when the measured rate $\Delta Ta$ of time-dependent change of the temperature increases over a predetermined value.

When seed crystals are used to grow the semiconductor polycrystal, the immediate suspension of the heating prevents melting of the seed crystals on the bottom of the crucible, and thus the control of the heating temperature is particularly preferred.

Slow cooling of the crucible is then initiated to solidify the melted raw semiconductor material. According to the production process of the invention, since the solidification is achieved while depriving the bottom of the crucible of heat, a crystal of a polycrystalline semiconductor grows with orientation from the bottom to the top of the crucible.

The production process of the present invention is characterized in that the solidification (that is, crystal growth) and annealing of the raw semiconductor material are concurrently performed by cooling in the solidification step. This may be achieved by periodically varying the amount of heat which is liberated from the raw semiconductor material. That is, the crystal grows during periods of larger amount of heat liberated, and is annealed during periods of smaller amount of heat liberated. The two processes are repeated over time in the solidification step to periodically vary the amount of heat liberated. For carrying out the production process according to the invention, assuming that the solid/liquid temperature is equal to the underside temperature T2 of the bottom of the crucible, the state of larger amount of heat liberated and the state of smaller amount of heat liberated are produced by adjusting T2 so that the solid/liquid temperature varies only within a predetermined range with its center at the melting point of the semiconductor (for example, approximately 1,420° C. for polysilicon). In this way, the invention allows the crystals to be released from distortion stress during solidification, and may provide distortion-stress-minimized, high-quality, crystallographically excellent semiconductor polycrystals with excellent reproducibility.

The quality of the resulting polycrystalline semiconductor is further improved by setting the total time of the periods of larger amount of heat liberated to ten times or less the total time of the periods of smaller amount of heat liberated.

When seed crystals are used to facilitate the growth of the crystal in the process for producing a polycrystalline semiconductor, setting the rate $\Delta Ta$ of time-dependent change of the underside temperature T2 of the bottom of the crucible to a value within the range of approximately 0.2° C./min. to 0.5° C./min. prevents melting of the seed crystals to improve the quality of the resulting polycrystalline semiconductor. In cases where $\Delta Ta$ is less than 0.2° C./min., not only the seed crystals but also the raw semiconductor material remain unmelted, and thus no homogeneous semiconductor polycrystal is produced. On the other hand, the seed crystals may be melted as well when $\Delta Ta$ is over 0.5° C./min., and this may prevent growth of a satisfactory polycrystal.

As described above, in the process for producing a polycrystalline semiconductor according to the invention, since a raw semiconductor material charged into the crucible is melted, and the raw semiconductor material is solidified to a crystal by cooling from the bottom of the crucible, the crystal grows in one direction from the bottom to the top of the crucible to provide a polycrystalline semiconductor with excellent crystallographic properties.

In addition, according to the invention, a thermocouple is provided at the bottom underside of the crucible to detect the rate ΔTa of time-dependent change of the underside temperature T2 of the bottom of the crucible while the raw semiconductor material is heated to a melt, to thereby control the heating, solidifying and cooling steps. As a result, the process for producing a polycrystal according to the invention is very repeatable, and the temperature control is ensured by simply burying a single thermocouple in the top of the supporting bed which is in contact with the bottom underside of the crucible; therefore the production process of the invention may be carried out at a lower cost. In addition, since the temperature control, the cooling, heating and solidification, and the location of the crucible as described above may be accomplished with single control means, it is possible to automate all the steps of the crystal growth process.

In addition, when a polycrystalline semiconductor is grown using seed crystals, since the melting of the seed crystals may be prevented with a high level of reliability, a high-quality polycrystalline semiconductor is obtained.

According to the invention, since the crystal is alternately subjected to growth and annealing, an improved polycrystalline semiconductor is provided which has a low EPD and minimized stress distortion, and thus resists cracking.

In addition, the EPD of the resulting polycrystalline semiconductor is further lowered by setting the total time of the periods of larger amount of heat liberated to ten times or less the total time of the periods of smaller amount of heat liberated.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
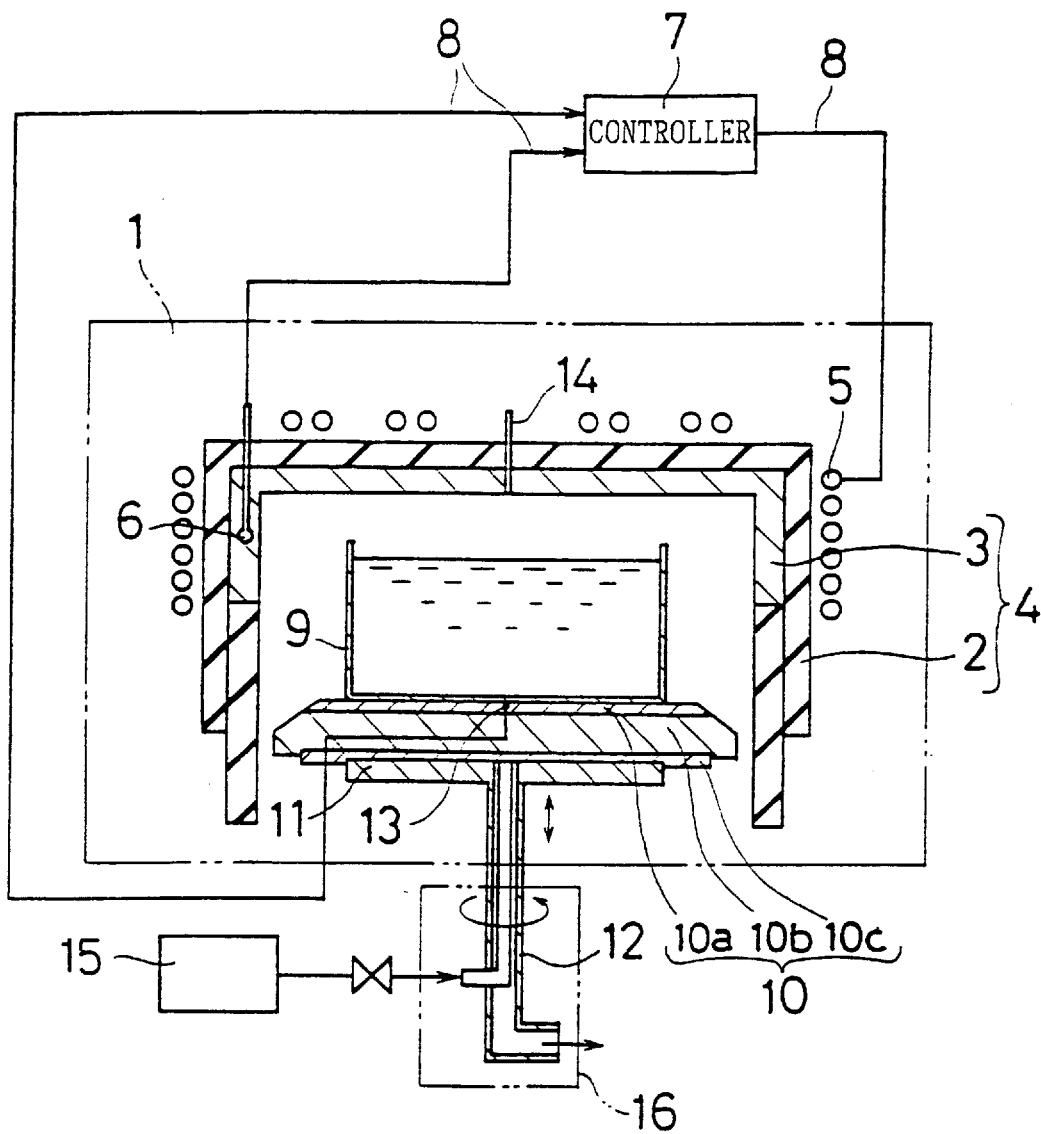
FIG. 1 is a schematic longitudinal section illustrative of the configuration of an apparatus for producing polycrystalline semiconductors according to the invention.

Now referring to the drawings, preferred embodiments of the invention are described below.

The process and the apparatus for producing polycrystalline semiconductors according to the present therein will now be explained in detail with reference to FIG. 1 through FIG. 8. Although the raw semiconductor material available for use according to the invention is exemplified by only silicon, other materials such as germanium (Ge) may be used as well.

FIG. 1 is a schematic longitudinal section illustrative of the configuration of an apparatus for producing polycrystalline semiconductors according to a first embodiment of the invention. This apparatus contains an airtight vessel 1 which prevents passage of air. The airtight vessel 1 may be configured to be connected to an exterior vacuum pump via a vacuum-tight door (not shown) to produce a vacuum inside the vessel. Alternatively, the vessel may be designed so as to internally circulate an inert gas (e. g., argon) at normal pressure (slightly positive), in which case the semiconductor heated to a melt in the vessel is not adversely affected by oxidation, since the atmosphere inside the vessel is non-oxidative.

As shown in the drawing, in the airtight vessel 1 there is provided a cylindrical heating furnace 4 comprising a heat insulator 2 and a heating member 3, located at a distance from the sidewall of the vessel. Both the heat insulator 2 and the heating member 3 are made of carbon fibers or graphite, for example. The heating member 3 may be constructed of an electric conductor such as metal. An induction heating coil 5 (at a frequency of 10 KHz) is wound around the heating furnace 4, particularly along the portion of its outer surface facing the heating member 3. The induction heating coil 5 heats the heating member 3 when energized. A first thermocouple 6 for measuring the temperature T1 (a first temperature) of the heating member 3 is buried in the sidewall of the heating member 3, sheathed in an installation tube.

The first thermocouple 6 and the induction heating coil 5 are connected to a controller 7 provided outside the airtight vessel 1 via respective leads 8. The controller 7 is designed to control power supply to the conduction heating coil 5 in response to output from the first thermocouple 6, to thereby increase or decrease the temperature of the heating furnace 4 as desired.

A crucible 9 into which a raw semiconductor material and further seed crystals, if necessary, are charged, is placed inside the airtight vessel 1. As shown in FIG. 1, the crucible 9 is placed in the inner space confined by the heating furnace 4 at proper distances from the sidewall and the top of the heating furnace 4. The crucible 9 may be made of a silica material or a graphite material, for example; it may also be made of another material such as tantalum, molybdenum, tungsten, silicon nitride or boron nitride. The crucible 9 may be shaped as desired as long as its geometry matches the inner configuration of the heating furnace 4, and may be either cylindrical or shaped as a square pole.

The crucible 9 is placed in the airtight vessel 1, with the bottom supported on the supporting bed 10. The supporting bed 10 is preferred to have a laminated structure constructed of a surface layer 10a and a bottom layer 10c made of graphite, and an intermediate layer 10b made of carbon fibers. The supporting bed 10 is mounted on a pedestal 11, and a cylindrical member 12 extending downward from the pedestal 11 allows the pedestal 11 to rotate about the central longitudinal axis. The rotation of the cylindrical member 12 is propagated to the crucible 9 via the pedestal 11 and the supporting bed 10, and therefore the crucible 9 also rotates as the cylindrical member 12 rotates. When a raw semiconductor material is charged into the crucible 9, and the crucible 9 is heated in the heating furnace 4, the rotation serves to provide the raw semiconductor material in the crucible 9 with an even distribution of temperature.

In addition, the pedestal 11 with a hollow double structure is equipped with a cooling section 11a (FIG. 2), and the cylindrical member 12 is also formed as a double pipe. A coolant (for example, cooling water) is forcedly circulated through the two to cool the supporting bed 10 supported on the pedestal 11. The coolant is continuously supplied from a coolant tank 15 to the cylindrical member 12. As a result, this cooling mechanism allows the supporting bed 10 to exchange heat with the underside of the bottom of the crucible which is in contact therewith to cool the bottom. The pedestal 11 and the cylindrical member 12 are driven to move up or down by driving means 16 provided outside the airtight vessel 1, and the crucible 9 is lifted or lowered in tandem with their upward or downward movement. The distance between the heating furnace 4 and the crucible 9 may be made shorter or longer in this manner. In addition, as mentioned above, the driving means 16 drives the rotation of the cylindrical member 12 about the axis.

A pyrometer 14 is attached to the head of the heating furnace 4, that is, the portion of the heating member 3 located just above the crucible 9. This pyrometer 14 detects the radiant heat of the raw semiconductor material in the crucible 9 to measure the surface temperature of the material. Accordingly, the pyrometer 14 is useful to determine the progress of melting of the charged raw semiconductor material while it is heated to a melt, or the progress of solidification of the material while it is cooled to solidity.

Figure 2:
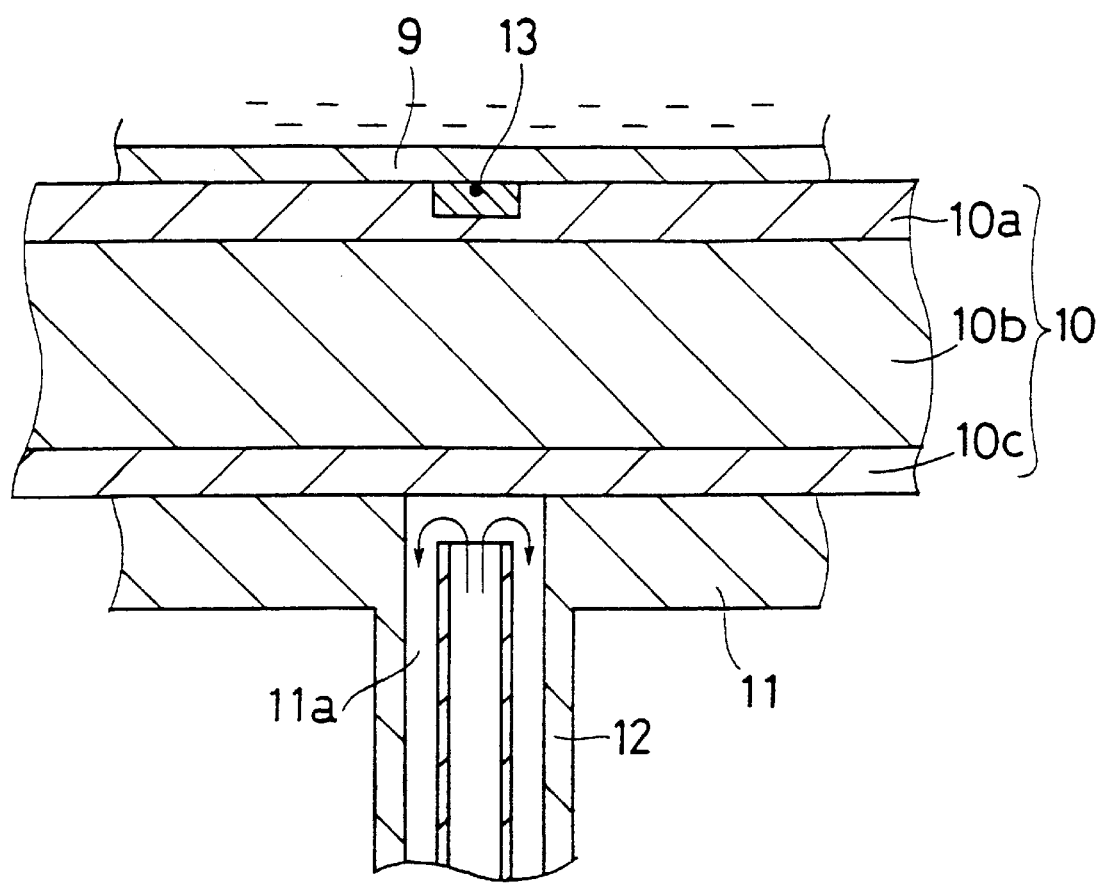
FIG. 2 is an enlarged longitudinal section of the main portion of the apparatus for producing polycrystalline semiconductors according to the invention.

A characteristic aspect of the configuration of the producing apparatus according to the invention resides in the provision of a second thermocouple 13 which is in contact with the underside of the bottom near the bottom center of the crucible 9, buried in the surface layer 10a of the supporting bed 10. FIG. 2 is an enlarged section of the main portion of the apparatus shown in FIG. 1, illustrative of the bottom center of the crucible 9 and the vicinity thereof. This thermocouple 13 is used to measure the underside temperature T2 (a second temperature) of the bottom of the crucible, and is electrically connected to the controller 7 via a lead 8 in the same manner as the first thermocouple 6. Accordingly, the controller 7 allows control of power supply to the induction heating coil 5 to increase or decrease the temperature of the heating furnace 4 in response to the temperature T2 output from the second thermocouple 13.

Figure 3:
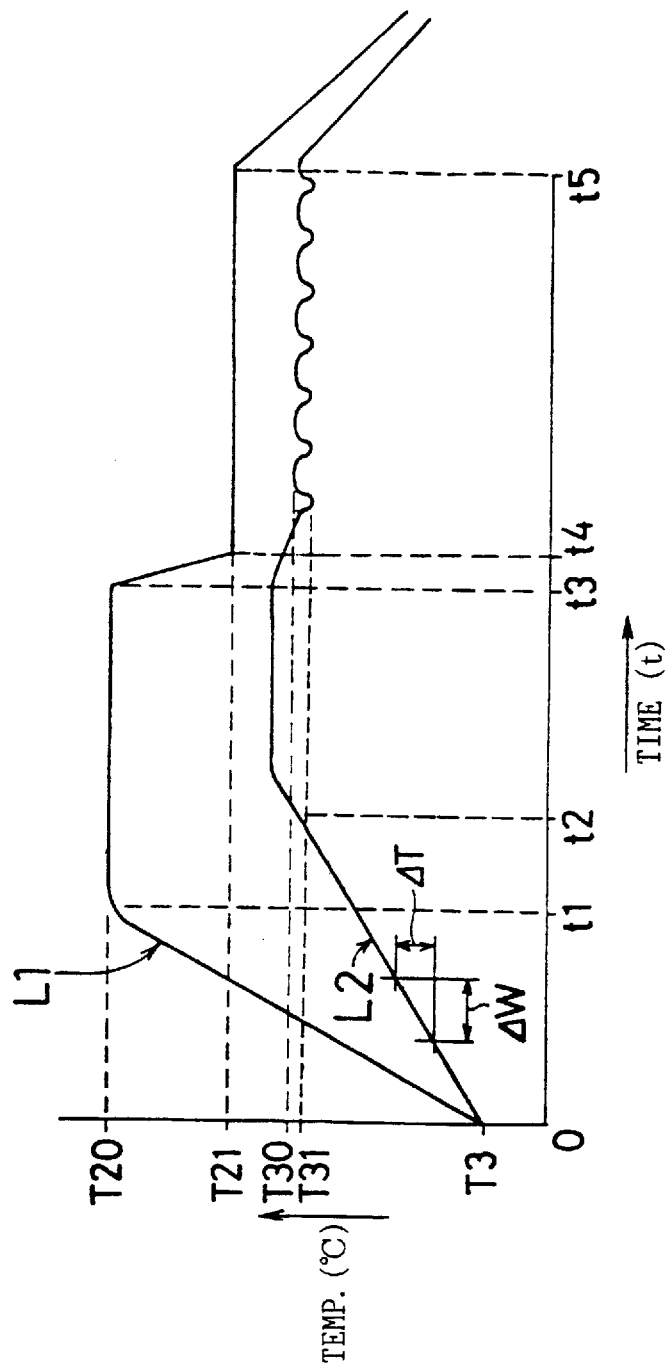
FIG. 3 is a temperature control profile illustrative of the time-dependent changes of temperatures T1 and T2 detected by a first thermocouple 6 and a second thermocouple 13.
Figure 4:
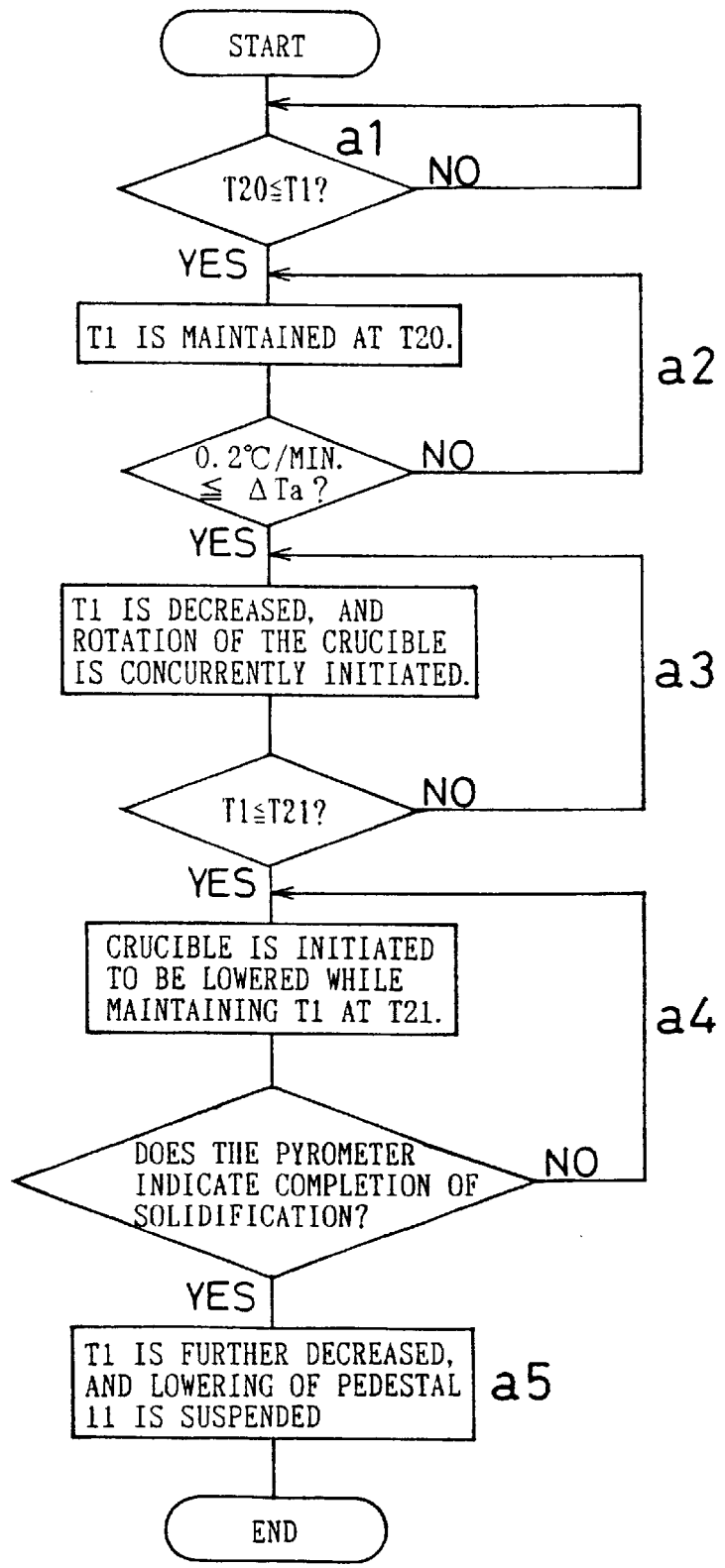
FIG. 4 is a flow chart illustrative of the operation of the controller 7 shown in FIG. 1.

FIG. 3 is a graph illustrative of the time-dependent change of the temperatures (output temperatures) T1 and T2 detected by the first thermocouple 6 and the second thermocouple 13. In the graph, L1 indicates the curve of T1, and L2 indicates the curve of T2. FIG. 4 is a flow chart illustrative of the operation of the controller 7 shown in FIG. 1. The controller 7 is used to perform the steps shown in FIG. 4 in response to output of the detected temperature T1 from the first thermocouple 6 and of the detected temperature T2 from the second thermocouple 13. According to the invention, it is also possible to track the change of T1 and T2 with time in FIG. 3, for example, instead of referring to a flow chart as shown in FIG. 4, to manually operate the controller 7 for the step of increasing or decreasing the temperature of the heating furnace 4 and the other steps of lifting or lowering the cylindrical member 12, for example.

According to an embodiment of the invention, the flow of the coolant circulating through the pedestal 11 of the production apparatus is adjusted in order to periodically vary the amount of heat liberated. Here, the amount of heat liberated is represented by the following expression when the coolant is water.

Amount of heat liberated (kW)=flow of the coolant l/min) $\times \Delta T/14.34$ wherein $\Delta T$ is the difference in temperature between the inlet and outlet for the coolant.

Figure 5:
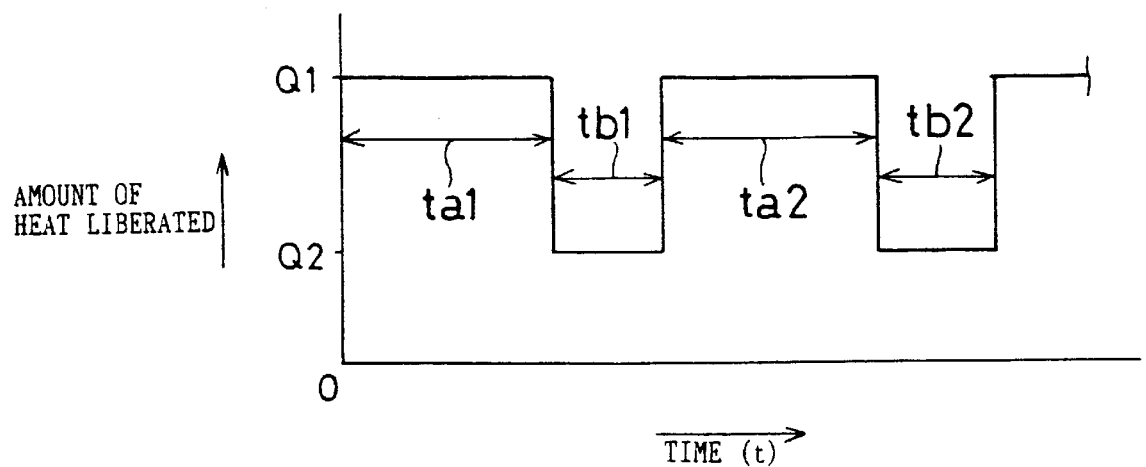
FIG. 5 is an illustration of the relationship between the amount of heat liberated and the time in the solidification and annealing steps according to the invention.

In order to periodically vary the amount of heat liberated as mentioned above, as illustrated in FIG. 5, a predetermined cooling pattern is set for the step of solidifying the raw semiconductor material, and the flow of the coolant is controlled so that the amount of heat liberated is switched between a larger setting (Q1) and a smaller setting (Q2). In FIG. 5, ta1, ta2 and so on indicate the time (period) during which the amount of heat liberated is Q1, and tb1, tb2 and so on indicate the time (period) during which the amount of heat liberated is Q2; ta1, ta2, etc. may be the same or different, and tb1, tb2, etc. may be the same or different as well. Since the values of Q1 and Q2 may depend on the size of the crucible, the structure of the pedestal, etc., they must be determined per batch for the production of the semiconductor.

According to the invention, the most simplest method of periodically varying the amount of heat liberated is periodic (up and down) variations of the solid/liquid temperature of the melted raw semiconductor material within a predetermined range with its center at the melting point of the raw semiconductor material. It is difficult to actually measure the solid/liquid temperature of the melted material in the solidification step during the process of production of the semiconductor. Therefore, the semiconductor is heated to a melt in the crucible 9 under substantially the same conditions as those intended for the production of the semiconductor, and a thermocouple is inserted into the melted raw semiconductor material which has initiated solidification, to measure and record the temperature of the thermocouple which has come into contact with the solid/liquid boundary as the "solid/liquid temperature". In addition, the temperature (T2) of the second thermocouple 13 is concurrently measured and recorded. The foregoing procedure is repeated a plurality of times to prepare a line for calibration of the solid/liquid temperature and the temperature T2 of the thermocouple 13. In this way, the solid/liquid temperature is approximated to the temperature of the second thermocouple 13 which may be read any time during the process of production of the semiconductor, that is, the underside temperature T2 of the bottom of the semiconductor. The invention allows the solid/liquid temperature of the semiconductor to be periodically increased and decreased in this way within a predetermined range with its center at the melting point of the raw semiconductor material. When the semiconductor is polycrystalline silicon, the "predetermined range" preferably is 1,420° C., the melting point of silicon, ±3° C. The "predetermined ranges" for the other semiconductors are allowable deviations from the melting points of the respective semiconductors, and may be easily determined by those skilled in the art on Judging whether crystal defects occur when solidified. If the predetermined ranges are set too broad, the cooling progresses too fast and causes crystal defects. In the case of silicon, a particularly preferred range of variations is on the order of ±2° C.

Figure 6:
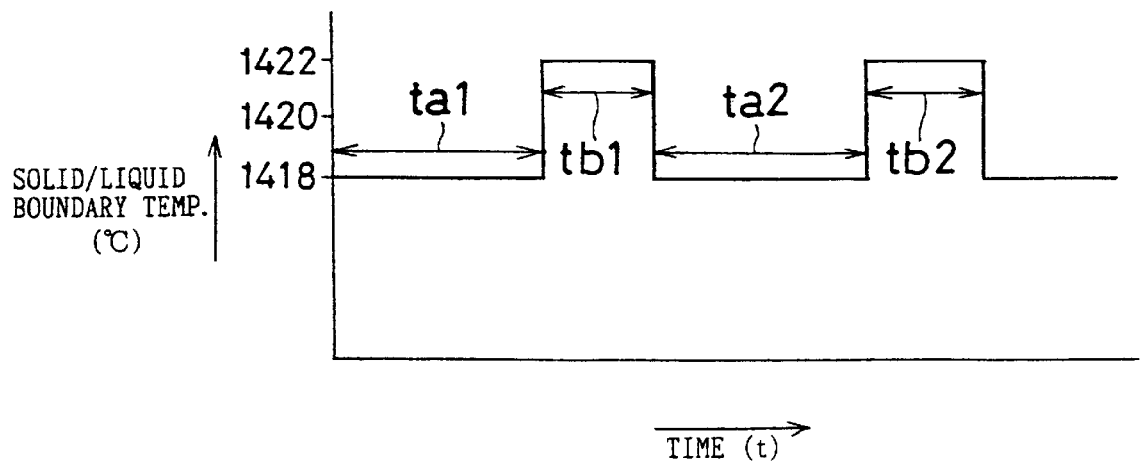
FIG. 6 is an illustration of the relationship between the solid/liquid temperature and the time in the solidification and annealing steps according to the invention.

FIG. 6 is an illustration of a mode of controlling the solid/liquid temperature of a polycrystalline silicon semiconductor, for example. The underside temperature T2 of the bottom of the crucible is controlled so that the solid/liquid temperature is 1,418° C. (1,420° C.–2° C.), and the temperature is maintained for a while (time ta1). T2 is then adjusted so that the solid/liquid temperature is 1,422° C. (1,420° C.+2° C.), and the temperature is maintained for a predetermined time (time tb1). The foregoing cycle is then repeated. The state in which the solid/liquid temperature is set to a temperature which is lower (−2° C. than the melting point of silicon matches the state of larger amount of heat liberated (Q1) described above, while the state in which the solid/liquid temperature is set to a temperature which is higher (+2° C.) than the melting point of silicon matches the state of smaller amount of heat liberated (Q2). The mode may be otherwise set, with different degrees of upward and downward deviations from the melting point of silicon; the temperature may be first set to a temperature which is lower (−2° C.), and then to a temperature which is higher (1° C.) than the melting point of silicon.

The underside temperature T2 of the bottom of the crucible, though being appropriately controlled by varying the flow of the coolant circulating the pedestal 11, may also be controlled using an alternative to the coolant. To achieve this, for example, a cooling mechanism may be configured as a two (or more)-circuit system which allows switching between the cooling media in the circuits through the use of a solenoid valve. The coolant available for use in such a configuration includes appropriate combinations of water, helium gas, carbon dioxide gas, etc. which are alternately used to control the cooling effect.

In any of the processes described above, the relationship between the total time of ta (that is, ta1+ta2+ . . . ) and the total time of tb (tb1+tb2+ . . . ) is particularly preferred to be such that the former is ten times or less the latter, according to the invention. The period ta is for the step of solidifying the semiconductor, while the period tb is for the step of annealing the semiconductor.

The constituent members of the apparatus for producing polycrystalline semiconductors according to a second embodiment of the invention are substantially the same as those of the production apparatus according to the first embodiment except for the supporting bed 10. The production apparatus according to the second embodiment is different from the production apparatus according to the first embodiment in that the supporting bed 10 of the latter apparatus has a hollow structure into and from which an adiabatic piece may be loaded and unloaded. This structure is achieved by forming an upper layer 10a, a bottom layer 10c and a side wall section with graphite, leaving a hollow section 20.

Figure 7:
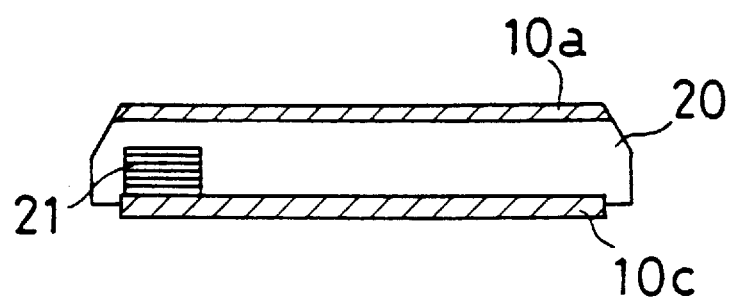
FIG. 7 is a longitudinal section illustrative of an example of the crucible-supporting bed 10 with a hollow structure which is used according to the invention.
Figure 8:
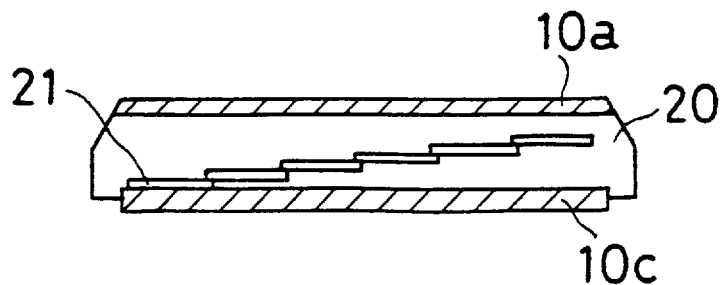
FIG. 8 is a longitudinal section illustrative of an extended state of an adiabatic piece placed in the hollow portion of the supporting bed shown in FIG. 7.

Although the cooling (solidification) progresses while depriving the bottom of the crucible 9 of heat according to the invention, when the supporting bed 10 has the hollow structure, that is, hollow section 20, heat transfers by radiation in the hollow section 20. Therefore, when an adiabatic piece 21 is inserted into the hollow section 20 to prevent the heat from radiating, the cooling from the underside of the bottom of the crucible may be controlled. The adiabatic piece which may be used for this purpose is preferably formed of one or more materials selected from the group consisting of gold, platinum, silver, tungsten, carbon fiber and tantalum. However, any other material may be used as well provided that it is a high-melting-point material having a low emissivity. The adiabatic piece may be shaped simply as a plate, or as a freely slidable layered structure, as illustrated in FIG. 7 and FIG. 8. When the adiabatic piece 21 is inserted into the hollow section 20 and then extended, the adiabatic piece 21 blocks thermal radiation between the upper layer 10a and the bottom layer 10c of the supporting bed 10. The state of smaller amount of heat liberated is brought about in this way, whereas the state of larger amount of heat liberated is established by removing or folding the adiabatic piece 21 (see FIG. 7).

Each step of the process for producing a polycrystalline semiconductor according to the invention will now be explained in detail. First, it is preferred to charge a raw semiconductor material, polysilicon, into the crucible 9 outside the airtight vessel 1 illustrated in FIG. 1.

The polysilicon-containing crucible 9 is placed on the top surface of the supporting bed 10 mounted on the pedestal 11, with the center of the crucible 9 being aligned with the centers of the pedestal 11 and the supporting bed 10. The driving means 16 is used to lift the cylindrical member 12 and the pedestal 11, and the crucible 9 is placed at a predetermined location inside the heating furnace 4. Prior to operation of the heating furnace 4, coolant is circulated through the pedestal 11 and the cylindrical member 12, and it is ascertained whether the bottom, particularly the bottom underside of the crucible 9 is cooled by the cooling mechanism.

In addition, prior to heating of the heating furnace 4, the cylindrical member 12 is rotated about the vertical axis by the driving means 16 to ensure uniform heating of the polysilicon in the crucible 9. A voltage is then applied across the induction heating coil 5 to heat the heating member 3 to thereby generate radiant heat which is used to heat the polysilicon in the crucible 9.

For the sake of clarity, the heating, the cooling and the solidifying steps which are included in the production process according to the invention will now be explained with reference to the flow chart of FIG. 4 and the temperature control profile of FIG. 3. Referring to FIG. 4, an AC with a frequency of approximately 7 kHz is applied across the induction heating coil 5 at step a1 to initiate its heating when its temperature is T3 (e.g., ambient temperature). The heating to increase the temperature is performed at a temperature gradient of approximately 400° C./hr. until the temperature T1 detected by the first thermocouple 6 reaches a predetermined temperature T2, for example, approximately 1,540° C. (until time t1, typically about 4.5 hours after the heating is initiated). Step a1 is repeated so long as step a1 results in a "NO", whereas upon a "YES" result the process proceeds to step a2 where electric power is supplied to the induction heating coil 5 to maintain the temperature T1 detected by the first thermocouple 6 at a predetermined temperature T20 under control by the controller 7.

At step a2, the polysilicon in the crucible 9 reaches its melting temperature (approximately 1,420° C.), and the melting proceeds from the top to the bottom of the crucible. The progress of melting may be monitored by the pyrometer 14. Since the coolant is circulated through the pedestal 11 as shown in FIG. 2, to cool the supporting bed 10 and further the bottom underside of the crucible, the lower portion, including the bottom, of the crucible 9 is kept at a lower temperature than the upper portion of the crucible. This is also apparent from the sharp leading edges of the gradients L1 and L2 shown in FIG. 3. Since the temperature T1 detected by the thermocouple 6 is maintained at the constant value T20 as mentioned above, and the heating through the upper portion and the sidewall of the crucible is continuous, the temperature T2 detected by the second thermocouple 13 increases along with the temperature Ti detected by the first thermocouple 6, though more slowly. As shown in FIG. 3, the gradient of L2 becomes flat (at time t2 about 2.5 hours after t1) as the temperature approaches the melting temperature of the silicon. As described above, since the polysilicon absorbs heat to melt during the flat-gradient period, the temperature T2 detected by the second thermocouple 13 is prevented from increasing. Therefore, the rate ΔTa (°C./min.) of time-dependent change of the temperature T2 per a unit time ΔW detected by the second thermocouple 13 is monitored based on the output from the second thermocouple 13, and when ΔTa reaches a predetermined value (e. g., 0.2° C./min.) or more (at time t3 about 4 hours after t2), the process proceeds to the next step a3 to lower the temperature T1 detected by the first thermocouple 6 at a temperature gradient of 300° C./hr. by the controller 7. Simultaneously, the pedestal 11 is lowered by the driving means 16 (at a lowering speed on the order of 7 mm/hr.). At the foregoing step a3, preferably the pedestal 11 is rotated at a speed of 1 rpm or less so that the temperature of the melting polysilicon is properly controlled. The rotation of the crucible 9 is continued even at the later steps. Step a2 is repeated while maintaining the temperature Ti detected by the first thermocouple 6 at the original predetermined value T20 so long as determination at step a2 results in a "NO".

In step a3, the temperature Ti detected by the first thermocouple 6 is further lowered until it reaches a predetermined temperature T21 (e. g., approximately 1,440° C.) (at time t4 about 0.3 hours after t3), at which time the process proceeds to step a4.

The supply of electric power to the induction heating coil 5 is continued under control by the controller 7 at step a4 to maintain the temperature T1 detected by the first thermocouple 6 at the predetermined temperature T21. At step a4, the flow of the coolant circulating through the pedestal 11 is controlled to set the temperature T2 detected by the second thermocouple 13 to T31 so that the solid/liquid temperature read from the solid/liquid calibration line described above is 1,418° C., for example. The controlled flow of the coolant is maintained for time ta1 (for example, 2 hours). The flow of the coolant is then decreased to set the temperature T2 detected by the second thermocouple 13 to T30 so that the solid/liquid temperature is 1,422° C. The decreased flow of the coolant is maintained for time tb1 (e.g., 0.5 hours). The flow of the coolant is then increased in fine increments to adjust the flow so that the temperature T2 detected by the second thermocouple 13 returns to T31. The increased flow is maintained for time ta2. The foregoing steps are repeated a required number of times. The completion of the solidification is indicated by a signal from the pyrometer. The sum of the total of ta1+ta2+ . . . (total time ta) and the total of tb1+tb2+(total time tb) is typically on the order of 14–17 hours.

Although the control of the temperature T2 detected by the second thermocouple 13 has been described with reference to only the method of controlling the flow of coolant, as is evident from the foregoing description, the temperature T2 may be effectively controlled by a variety of methods, including replacement of the coolant, or having the adiabatic piece 21 to be loaded in and unloaded from the hollow section 20 of the supporting bed 10.

The process proceeds to step a5 when step a4 is finished (at t5), and the temperature T1 detected by the first thermocouple 6 is decreased from T21 to approximately ambient temperature at a temperature gradient of 100° C./hr.

At step a5, after cooling of the silicon has been ascertained (about 15 hours later), the crucible 9 is taken out of the airtight vessel 1. The produced polysilicon ingot is then removed from the crucible 9 to provide polycrystalline silicon which has solidified in a single direction from the bottom to the top of the crucible. Typically, it takes approximately 40 hours to finish steps a1 through a5.

The invention may be very advantageously carried out by presetting the setting temperatures T20, T21, T30 and T31, the rate ΔTa of time-dependent change of the temperature detected by the second thermocouple 13, which are referred to at steps a1, a2, a3 and a4, to appropriate values which are inputted to a computer so as to allow subsequent judgment at each step based on whether found values have reached these preset values, and to control the controller 7 in order to carry out the step of controlling the temperature in the heating furnace 4 and the cooling and solidification steps.

The invention will now be described in more detail with reference to the Examples.

EXAMPLES 1a THROUGH 1c

Silicon seeds ((CZ(100), 5 inches in diameter and 10 mm in thickness)) were placed on the bottom center of a crucible (a square pole 55 cm in width and 40 cm in height). Preferably silicon seeds pre-treated by chemical etching (30μ) were used as the silicon seeds. The etching provided smoother crystal surfaces suitable for crystal growth. Approximately 140 kg of polysilicon to be melted was charged into the crucible.

Steps a1 through a5 described above were carried out to produce polycrystalline silicon ingots. In the present examples, the solid/liquid temperature was periodically varied between 1,419° C. and 1,421° C. (that is, ΔTb±1° C.) at step a4. The time ratio ta/tb at solidification and annealing step a4 was approximately 5. The time required for the solidification step (step a4) was approximately 16–17 hours (16.5 hrs. in Example 1a; 17.2 hrs. in Example 1b; and 17.5 hrs. in Example 1c). The EPDs of the polycrystalline silicon ingots obtained in the respective examples were measured for evaluation of the quality thereof. The EPDs were measured according to JIS H0609. The results of measurement of the EPDs and the main production and testing conditions are listed in Table 1.

EXAMPLES 2a–2c

Polycrystalline silicon ingots were produced likewise in Examples 1a–1c, except that the solid/liquid temperature was periodically varied between 1,418° C. and 1,422° C. (that is, ΔTb±2° C.). The other production and testing conditions and the EPDs of the resulting polycrystalline silicon ingots are listed in Table 1.

EXAMPLES 3a–3c

Polycrystalline silicon ingots were produced likewise in Examples 1a–1c, except that the solid/liquid temperature was periodically varied between 1,417° C. and 1,423° C. (that is, ΔTb±3° C.). The other production and testing conditions and the EPDs of the resulting polycrystalline silicon ingots are listed in Table 1.

Comparative Example

Polycrystalline silicon ingots were produced likewise in the examples, except that the solid/liquid temperature set to 1,418° C. in step a4 was maintained, and the solidification step was carried out at the temperature. The EPDs of the resulting polycrystalline silicon ingots are listed in Table 1.

TABLE 1

|  | ΔTb | ta/tb | Solidification time (h) | EPD (×10⁴/cm²) |
|---|---|---|---|---|
| Example 1a |  |  | 16.5 | 2 |
| 1b | ±1° C. | 5 | 17.2 | 1 |
| 1c |  |  | 17.5 | 5 |
| Example 2a |  |  | 15.0 | 2 |
| 2b | ±2° C. | 10 | 14.8 | 1 |
| 2c |  |  | 15.3 | 6 |
| Example 3a |  |  | 14.5 | 9 |
| 3b | ±3° C. | 20 | 14.4 | 8 |
| 3c |  |  | 14.7 | 13 |
| Comparative Example | −2° C. | — | 14.0 | 15 |

As is clear from the listed results of the Examples and the Comparative Example, the polycrystalline silicon ingots of the Examples are characterized by having lower EPDs than the EPD of the ingot of the Comparative Example; particularly, when the time ratio ta/tb in the solidification/annealing step is 10 or less, the EPDs are further lowered, and satisfactory polycrystalline ingots are obtained.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An apparatus for producing polycrystalline semiconductors comprising:

an airtight vessel;

a crucible having a bottom placed in the airtight vessel for receiving a raw semiconductor material;

heating means for heating the crucible at a level above the crucible bottom to melt the raw semiconductor material;

a supporting bed which supports the underside of the bottom of the crucible to mount the crucible, and has a hollow structure which allows an adiabatic piece to be loaded in and unloaded from the hollow structure;

cooling means for cooling the supporting bed; and driving means for driving rotation of the supporting bed about a vertical axis thereof, as well as for driving upward and downward movement of the supporting bed.

2. The apparatus according to claim 1, further comprising:

a first-temperature detecting means for detecting a first temperature T1 at which the crucible is heated by the heating means;

a second-temperature detecting means for detecting a second temperature T2 of the bottom underside of the crucible; and control means for controlling the heating means so that the first temperature T1 increases over the melting temperature of the raw semiconductor material in response to respective outputs of the first-temperature detecting means and the second-temperature detecting means, and so that the first temperature T1 falls at the instant the rate ΔT of time-dependent change of the second temperature T2 detected by the second-temperature detecting means increases over a rate of time-dependent change for increasing the temperature after melting the raw semiconductor material.

* * * * *